United States Patent [19]

Rountree

[11] Patent Number: 4,939,616
[45] Date of Patent: Jul. 3, 1990

[54] CIRCUIT STRUCTURE WITH ENHANCED ELECTROSTATIC DISCHARGE PROTECTION

[75] Inventor: Robert N. Rountree, Richmond, Tex.

[73] Assignee: Texas Instruments Incorporated, Dallas, Tex.

[21] Appl. No.: 434,592

[22] Filed: Nov. 13, 1989

Related U.S. Application Data

[63] Continuation of Ser. No. 265,746, Nov. 1, 1988, abandoned.

[51] Int. Cl.$^5$ .............................................. H02H 9/04
[52] U.S. Cl. ...................................... 361/56; 361/58; 361/91; 361/111
[58] Field of Search ................... 361/58, 91, 111, 110; 357/23.13, 42, 35, 43, 51, 46; 307/303

[56] References Cited

U.S. PATENT DOCUMENTS

| | | | |
|---|---|---|---|
| 4,327,368 | 4/1982 | Uchida | 357/42 |
| 4,689,653 | 8/1987 | Miyazaki | 357/42 |
| 4,739,437 | 4/1988 | Morgan | 361/58 |

*Primary Examiner*—Todd E. Deboer
*Attorney, Agent, or Firm*—Lawrence J. Bassuk; Thomas W. DeMond; Melvin Sharp

[57] ABSTRACT

The described embodiments of the present invention provide an input protection device with a low trigger threshold. The structure is a silicon controlled rectifier (SCR) type of device wherein the triggering mechanism is avalanche conduction at the interface between the N-well surrounding a portion of the protection device and the P-type substrate. The embodiments provide a lowered threshold voltage by providing a highly doped region of the same conductivity type as the well at the interface between the well and the substrate. This highly doped region is connected to a resistor which is then connected to the protected node. The resistor and heavily doped region at the intersection between the N-well and substrate provides an additional source of current for avalanching at a lower voltage. Thus the trigger voltage of the protection system is substantially lowered. In other embodiments of the present invention an additional source of triggering current is provided by an N+ contact region in the N-well which is close to the interface between the N-well and the P substrate adjacent to the area closest to the N+ emitter of the silicon controlled device. Either of these highly doped charge injection regions may be fed by resistors fabricated with the heavily doped regions themselves or may utilize the N-well itself as a resistive element.

16 Claims, 4 Drawing Sheets

CIRCUIT STRUCTURE WITH ENHANCED ELECTROSTATIC DISCHARGE PROTECTION

CROSS-REFERENCE TO RELATED APPLICATIONS

This application is a continuation of application Ser. No. 265,746, filed Nov. 1, 1988, now abandoned.

The related case Ser. No. 213,499 is copending. The related case Ser. No. 287,427 is now U.S. Pat. No. 4,896,243.

FIELD OF THE INVENTION

The present invention relates to the field of input protection circuitry for sensitive electrical devices such as integrated circuitry. More specifically, the present invention relates to the field of protection of over-voltage conditions such as in electrostatic discharge situations.

BACKGROUND OF THE INVENTION

Input protection circuitry is an essential part of modern integrated circuits, particularly in the area of field effect transistor based devices. Extremely small delicate device structures are very sensitive to the high voltages which may be generated by the electrostatic charge developed in the human body. During installation of integrated circuits into products, these electrostatic discharges may destroy integrated circuits and thus require expensive and tedious repairs on fully manufactured devices which could have been avoided by providing a mechanism for dissipation of the electrostatic discharge on the integrated circuit. This problem is particularly acute in complimentary metal oxide semiconductor field effect transistor type integrated circuits. In high density CMOS devices, an extremely high voltage may be developed by electrostatic discharge which easily destroys the very thin gate oxides and very short channel devices of the integrated circuit.

To protect against these over-voltage conditions it has been proposed that a silicon controlled rectifier (SCR) structure compatible with complementary metal oxide semiconductor (CMOS) processing be utilized. This structure is shown in copending application Ser. No. 213,499, filed June 27, 1988 and assigned to the assignee of this application. This structure provides excellent protection but the SCR protection device has a very high threshold voltage. This threshold voltage is commonly on the order of 70-80 volts. It has been found in many present day circuits that a 70-80 volt threshold is inadequate to protect some devices on the integrated circuit. Therefore, it is highly desirable to provide an input protection structure which greatly reduces the threshold voltage of the input protection device, is simple and is compatible with CMOS processing.

SUMMARY OF THE INVENTION

The described embodiments of the present invention provide an input protection device with a low trigger threshold. The structure is a silicon controlled rectifier (SCR) type of device wherein the triggering mechanism is avalanche conduction at the interface between the N-well surrounding a portion of the protection device and the P-type substrate. Of course, opposite doping types may be effectively used from those disclosed in the described embodiments. The embodiments provide a lowered threshold voltage by providing a highly doped region of the same conductivity type as the well at the interface between the well and the substrate. This highly doped region is connected to a resistor which is then connected to the protected node. The resistor and heavily doped region at the intersection between the N-well and substrate provides an additional source of current for avalanching at a lower voltage. Thus the trigger voltage of the protection system is substantially lowered. In other embodiments of the present invention an additional source of triggering current is provided by an N+ contact region in the N-well which is close to the interface between the N-well and the P substrate adjacent to the area closest to the N+ collector of the silicon controlled device. Either of these highly doped charge injection regions may be fed by resistors fabricated along with the heavily doped regions themselves or may utilize the N-well itself as a resistive element.

BRIEF DESCRIPTION OF THE DRAWINGS

The present invention may be better understood with regard to the embodiments described in the following detailed description when read in conjunction with the drawings, wherein.

DETAILED DESCRIPTION

Figure 1:
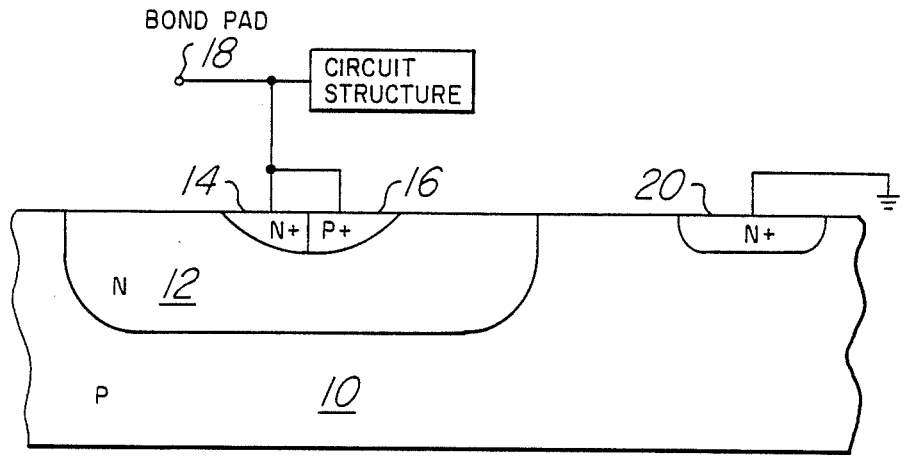
FIG. 1 is a side view schematic diagram of a prior art SCR type input protection device.
Figure 2:
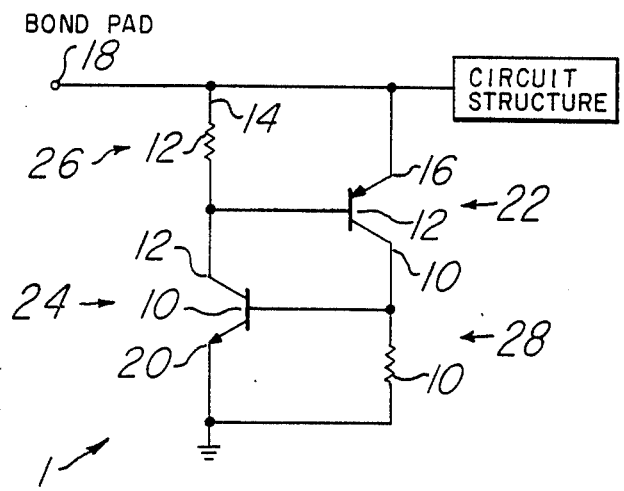
FIG. 2 is an equivalent schematic diagram of the input protection device of FIG. 1.
Figure 3:
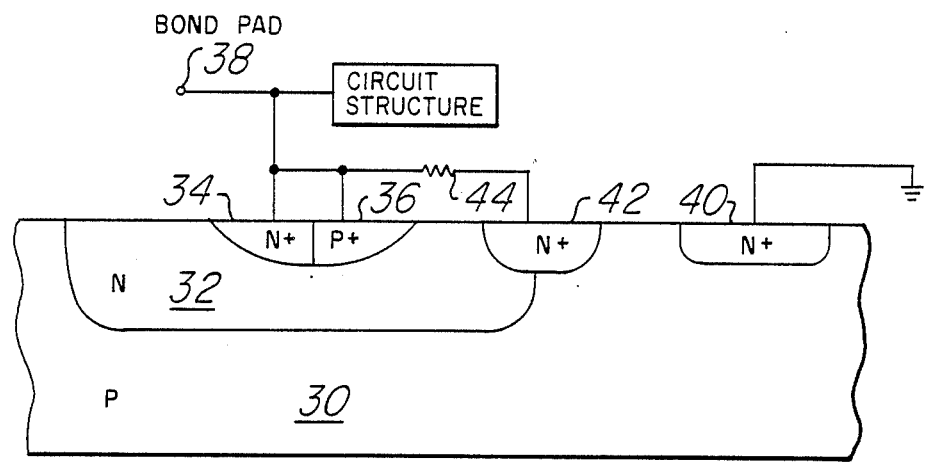
FIG. 3 is a side view schematic diagram of one embodiment of the present invention.
Figure 4:
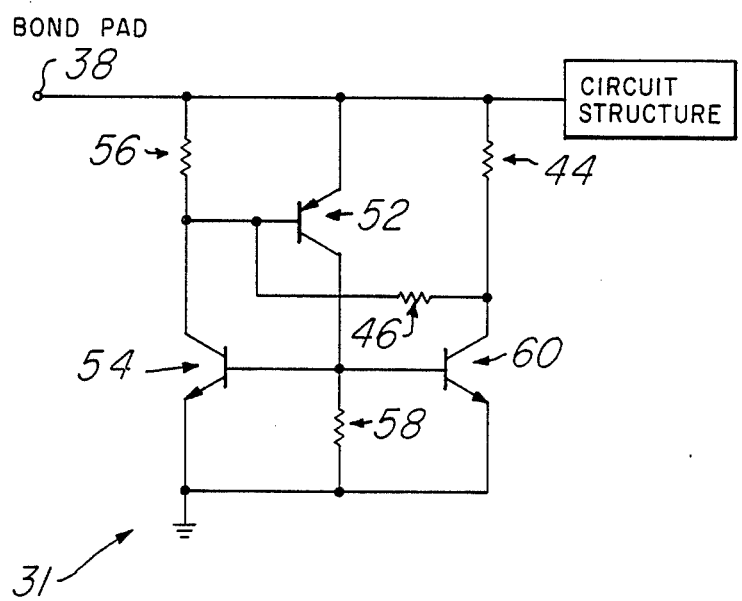
FIG. 4 is an equivalent schematic diagram of the input protection device of FIG. 3.
Figure 5:
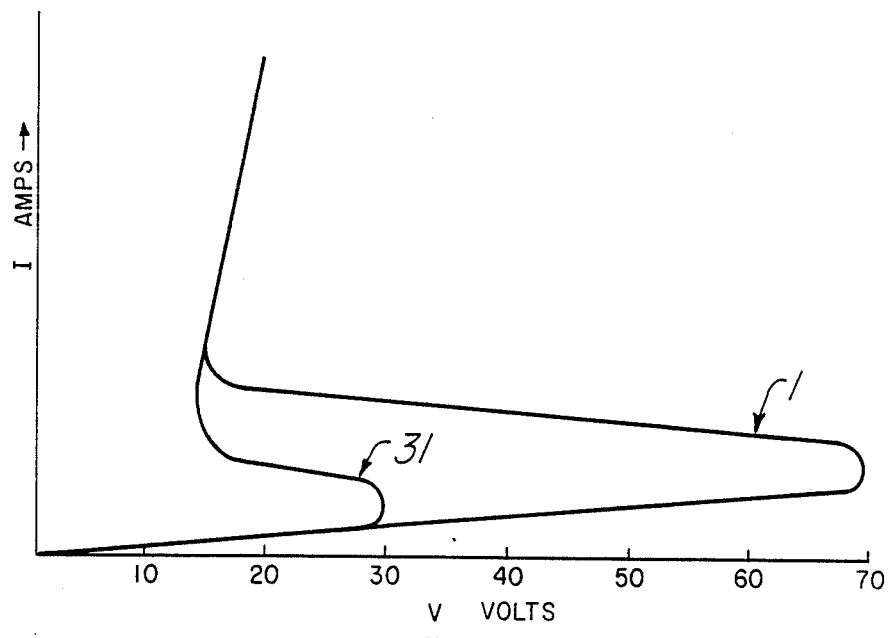
FIG. 5 is a graph depicting the triggering voltages of the devices of FIGS. 1 and 3.
Figure 6:
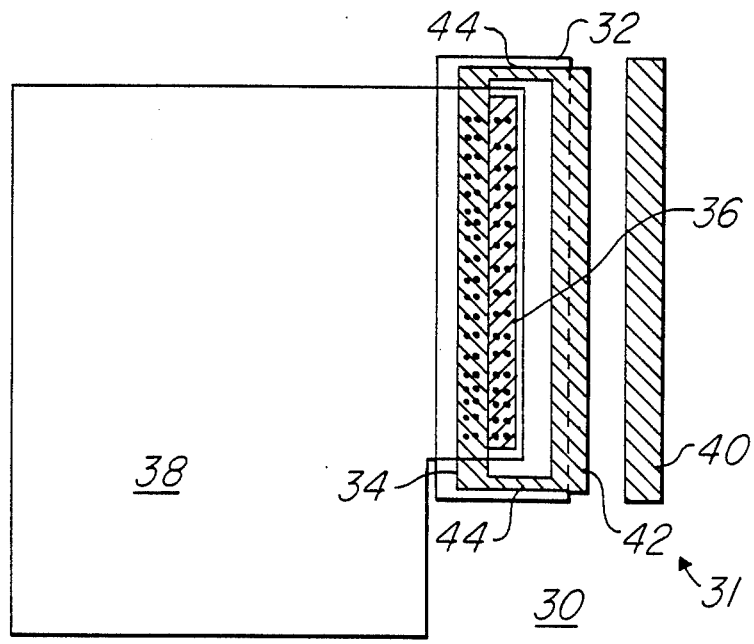
FIG. 6 is a plan view diagram of one embodiment of the present invention.
Figure 7:
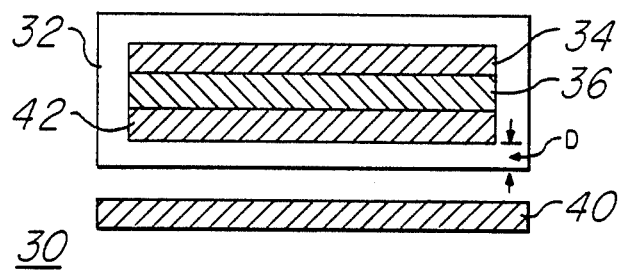
FIG. 7 is a partial plan view diagram of another embodiment of the present invention.
Figure 8:
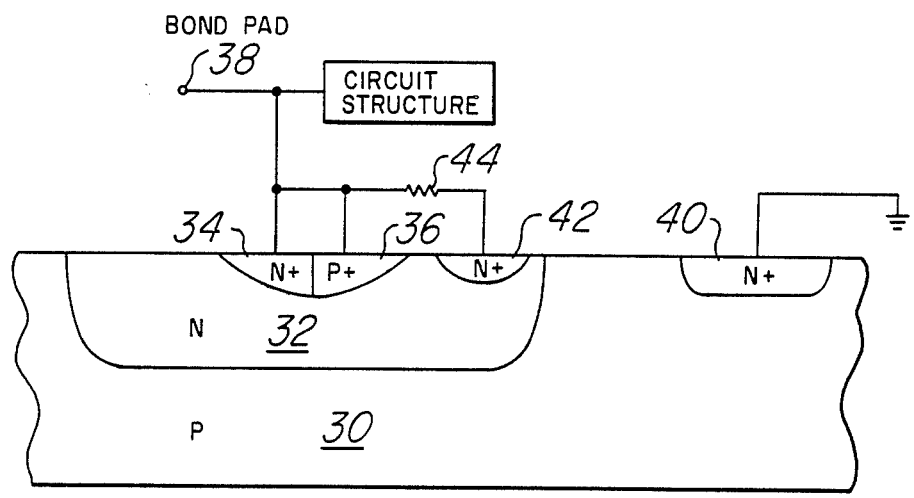
FIG. 8 is a side view schematic diagram of another embodiment of the present invention.

The present invention is best understood with regard to the specific embodiments described herein. FIG. 1 is a sideview schematic diagram of a prior art protection device. FIG. 2 is an electrical schematic diagram of that device. FIG. 3 is a sideview schematic diagram showing one embodiment of the present invention. FIG. 4 is a electrical schematic diagram of the embodiment of FIG. 3. FIG. 5 is a graph depicting a performance comparison of the devices of FIG. 1 and FIG. 3. FIG. 6 is a layout of one embodiment of the present invention. FIG. 7 is a partial layout diagrams of another embodiment of the present invention. FIG. 8 is a side view schematic diagrams of yet another embodiment of the present invention.

FIG. 1 is a side view schematic diagram of a prior art over-voltage protection device. Protection device 1 is formed in a silicon semiconductive substrate 10 which is lightly doped P-type. Lightly doped N-well 12 is formed in substrate 10. Heavily doped region 14 is doped N-type and heavily doped region 16 is doped P-type. Both of these regions are electrically connected to a bond pad 18 of the integrated circuit containing over-voltage protection device 1. Heavily doped region 20 is N-type, is laterally spaced from N-well 12 and is connected to ground or a reference potential.

FIG. 2 is an electrical schematic diagram showing the electrical characteristics of the device shown in FIG. 1. The regions which correspond to regions of FIG. 1 are indicated in small numerals. For example, transistor 22 includes an emitter which is provided by region 16 of FIG. 1, a base which is provided by region 12 of FIG. 1 and a collector which is provided by substrate 10 of FIG. 1. Similarly, transistor 24 is formed having a collector provided by region 12 of FIG. 1, a base provided by substrate 10 of FIG. 1 and an emitter provided by region 20 of FIG. 1. Resistor 12 is provided by the resistive nature of lightly doped N-well 12 extending from heavily doped N+ region 14 and along the interface with P+ region 16. Resistor 28 is provided by the resistance of substrate 10 between protection device 1 and further connection of substrate 10 to ground (not shown). When protection device 1 is included in an integrated circuit using substrate biasing, such as is commonly used in dynamic random access memories, the schematic representation of the device must include the charge pump and usually a PN diode drop from the base of transistor 24 to ground. This complicates the operational analysis of the over-voltage protection device 1 in this circumstance, but proper operation of such devices has been experimentally verified.

When a positive potential is placed on bond pad 18, the base-emitter junction of transistor 22 is forward biased and the base-collector junction is reversed biased. This positive potential also reverse biases the base-collector junction of transistor 24 and forward biases the base-emitter junction of transistor 24. Referring to FIG. 1, thus P+ region 16 to N-well 12 junction is forward biased, the N-well 12 to P substrate 10 junction is reversed biased and the P substrate 10 to N+ region 20 junction is forward biased. Although two junctions of the device are forward biased, very little current is conducted by the device because of the reverse biased junction between the N-well and the P substrate. When the voltage level on bond pad 18 becomes highly elevated, around 70-80 volts, avalanche production of minority carriers at the interface between N-well 12 and P substrate 10 provides enough current to turn on transistor 24 (FIG. 2). Thus the protection device becomes highly conductive and remains conductive because transistor 24 provides base biasing for transistor 22. Electrostatic discharge conditions generally provide very high voltages with very little charge. Thus the charge is quickly dissipated by the device of FIG. 2. When insufficient current flows through resistors 12 and 10 to forward bias transistors 22 and 24, respectively, transistors 22 and 24 will turn off and protection device 1 will again become nonconductive. Although the device of FIGS. 1 and 2 provides good over-voltage protection for very high voltages, many devices such as output driver transistors require protection at a much lower voltage level than the 70 to 80 volts provided by the device shown in FIGS. 1 and 2. FIGS. 3 and 4 show an embodiment of the present invention which overcomes this high threshold voltage problem.

FIG. 3 is a side view schematic diagram of one embodiment of the present invention. Over-voltage protection device 31 serves the same function as over-voltage protection device 1 of FIG. 1. Elements 30, 32, 34, 36, 38 and 40 operate in the same manner as elements 10, 12, 14, 16, 18 and 20, respectively, of the device of FIG. 1. Over-voltage protection device 31 further includes N+ region 42 at the interface between N region 32 and P substrate 30. In addition, over-voltage protection device 31 includes resistor 44. Region 42 lowers the avalanche conduction threshold of over-voltage protection device by providing a source of current at the interface between N-well 32 and P substrate 30. FIG. 4 is an electrical schematic diagram of over-voltage protection device 31 of FIG. 3. Transistors 52 and 54 and resistors 56 and 58 function in the same manner as described for transistors 22 and 24 and resistors 26 and 28 of FIG. 2. Transistor 60 has a collector formed by N+ region 42, a base formed by P substrate 30 and an emitter formed by n+ region 40. Resistor 46 is provided by the resistive nature of the lightly doped N-well 32. Resistor 44 connects the emitter of transistor 52 to the collector of transistor 60. Resistor 46 connects the base of transistor 52 to the collector of transistor 60. Transistor 60 functions as a low avalanche threshold trigger transistor. Because of the abrupt junction between N+ region 42 and P substrate 30, transistor 60 will go in to avalanche conduction at a to lower voltage than transistor 54. When transistor 60 conducts, it provides biasing current to the base of transistor 54 which in turn provides base current to turn on transistor 52. Thus over-voltage protection device 31 remains conductive until inadequate current flows through resistors 56 and 58 to provide a biasing voltage drop for transistors 52 and 54.

FIG. 5 is a graph showing the current to voltage characteristic between bond pads 18 or 38 and ground for over-voltage protection devices 1 and 31. As can clearly be seen from the graph, over-voltage protection device 31 goes into a high conductivity state at a much lower voltage. In this graph over-voltage protection device 31 begins to conduct at approximately 30 volts whereas over-voltage protection device 1 begins to conduct at around 70 volts.

FIG. 6 is a layout diagram of one method of laying out over-voltage protection device 31. Bond pad 38 is connected through the vias (represented as dots) to N+ region 34 and P+ region 36. Thin portions of N+ diffusion around the RM ends of N+ diffusion 34 provide resistance of resistor 44 and are then connected to N+ region 42. Doped regions of over-voltage protection device 31 may be advantageously formed in substrate 30 using masking and ion implantation techniques which are well known in the art. On the other hand, other doping techniques may be used, such as diffusion from a solid source. N-well 32 is formed at the same time the N-wells for P type field effect transistors are formed on the integrated circuit containing over-voltage protection device 31. N+ regions 34, resistive regions 44 and N+ region 42 are formed at the time N-channel source/drain formation is performed for forming N-channel transistors on the integrated circuit. P+ region 36 is formed at the time the source/drain formation is conducted for P channel transistors for the other components of the integrated circuit. Therefore, the embodiment of FIG. 3 including the more specific embodiment of FIG. 6 is completely compatible with CMOS fabrication processes.

An important aspect of the present invention is the inclusion of resistor 44 (FIG. 4). Resistor 44 prevents excessive current through transistor 60 (as opposed to no resistance) and thus prevents destruction of the device. Excessive current would cause transistor 60 to fail and thus be a short to ground which would cause a virtual short between bond pad 38 and ground. The specific value of resistor 44 depends upon the robustness of construction of the integrated circuit in general. Resistance values from approximately 0.6 Ωs up to 40 Ωs have been experimentally verified as providing reasonable operation of the over-voltage protection device. However, as yet, absolute maximum and minimum voltages have not yet been determined. However, an extremely wide range of resistances appears to provide good operation and the precise value of the resistor does not appear to be critical.

FIG. 7 is another layout embodiment of the present invention. FIG. 7 shows the positioning of N+ region 42 inside the interface between N-well 32 and substrate 30. It has been determined that modifying distance D can allow for relatively precise control of the trigger voltage of the over-voltage protection device shown in FIG. 7 RM.

FIG. 8 is yet another embodiment of the present invention. In the embodiment of FIG. 8 RM, N+ region 42 is positioned slightly away from the interface between N-well 32 and P substrate 30 and is positioned within N-well 32. With this positioning, N+ region 42 does not have an appreciable effect on the avalanche threshold voltage until the voltage on bond pad 38 reaches the level where the depletion region between N-well 32 and P substrate 30 intersects with N+ region 42. Because the interface between N-well 32 and P substrate 30 remains a low doped interface on both sides of the junction, it is believed that the embodiment of FIG. 8 will provide a higher threshold voltage than the embodiment of FIG. 3 but a lower threshold voltage than the prior art device shown in FIG. 1. A modification of this embodiment (not shown) is realized by positioning N+ region 42 in P type substrate 30 between N-well 32 and N+ region 40.

Although specific embodiments of the present invention are disclosed herein they are not to be construed as limiting the scope of the invention. For example, the described embodiments provide over-voltage protection for positive over-voltage situations. It is clearly within the scope of the invention that changed doping polarities will provide over-voltage protection for opposite polarities. In addition, the described embodiments are utilized in conjunction with integrated circuitry. The present invention is not limited to integrated circuitry in any way and may advantageously provide over-voltage protection for discrete type devices. The present invention is only limited by the claims appended hereto.

What is claimed is:

1. A silicon controlled rectifier device for protecting a circuit structure which is coupled to a first node, comprising in combination:
   a lightly doped region having a first conductivity type formed in a lightly doped substrate having a second conductivity type;
   a first heavily doped region formed in said lightly doped region having said first conductivity type, said first heavily doped region being electrically connected to said first node;
   a second heavily doped region formed in said lightly doped region having said second conductivity type, said second heavily doped region being electrically connected to said first node;
   a third heavily doped region formed in said substrate having said first conductivity type, said third heavily doped region being spaced from said lightly doped region and said third heavily doped region being electrically connected to a second node;
   a fourth heavily doped region formed at the intersection of said lightly doped region and said substrate having said first conductivity type, said fourth heavily doped region positioned between said second and third heavily doped regions; and
   a resistor having a first terminal electrically connected to said first node and having a second terminal electrically connected to said fourth heavily doped region, said combination forming a silicon controlled rectifier device which provides an over-voltage current path between said first and second nodes to protect the circuit structure from damage of the type caused by electrostatic discharge between said nodes.

2. The device of claim 1 formed on an integrated circuit.

3. The device of claim 1 wherein said first conductivity type is N and said second conductivity type is P.

4. The device of claim 1 wherein said first node is a bond pad of an integrated circuit.

5. A silicon controlled rectifier device for protecting a circuit structure which is coupled to a first node, comprising in combination:
   a lightly doped region having a first conductivity type formed in a lightly doped substrate having a second conductivity type;
   a first heavily doped region formed in said lightly doped region having said first conductivity type, said first heavily doped region being electrically connected to said first node;
   a second heavily doped region formed in said lightly doped region having said second conductivity type, said second heavily doped region being electrically connected to said first node;
   a third heavily doped region formed in said substrate having said first conductivity type, said third heavily doped region being spaced from said lightly doped region and said third heavily doped region being electrically connected to a second node;
   a fourth heavily doped region formed in said lightly doped region having said first conductivity type, said fourth heavily doped region positioned between said second and third heavily doped regions; and
   a resistor having a first terminal electrically connected to said first node and having a second terminal electrically connected to said fourth heavily doped region, said combination forming a silicon controlled rectifier device which provides an over-voltage current path between said first and second nodes to protect the circuit structure from damage of the type caused by electrostatic discharge between said nodes.

6. The device of claim 5 formed on an integrated circuit.

7. The device of claim 5 wherein said first conductivity type is N and said second conductivity type is P.

8. The device of claim 5 wherein said first node is a bond pad of an integrated circuit.

9. A silicon controlled rectifier device for protecting a circuit structure which is coupled to a first node, comprising in combination:
   a lightly doped region having a first conductivity type formed in a lightly doped substrate having a second conductivity type;
   a first heavily doped region formed in said lightly doped region having said first conductivity type, said first heavily doped region being electrically connected to said first node;

a second heavily doped region formed in said lightly doped region having said second conductivity type, said second heavily doped region being electrically connected to said first node;

a third heavily doped region formed in said substrate having said first conductivity type, said third heavily doped region being spaced from said lightly doped region and said third heavily doped region being electrically connected to a second node;

a fourth heavily doped region formed in said lightly doped substrate having said first conductivity type, said fourth heavily doped region positioned between said second and third heavily doped regions; and a resistor having a first terminal electrically connected to said first node and having a second terminal electrically connected to said fourth heavily doped region, said combination forming a silicon controlled rectifier device which provides an overvoltage current path between said first and second nodes to protect the circuit structure from damage of the type caused by electrostatic discharge between said nodes.

10. The device of claim 9 formed on an integrated circuit.

11. The device of claim 9 wherein said first conductivity type is N and said

12. The device of claim 9 wherein said first node is a bond pad of an integrated circuit.

13. A semiconductor structure including an integrated circuit and protection circuitry for preventing damage to said integrated circuit during an electrostatic discharge event, said circuit formed in the surface of a lightly doped semiconductor material and connected to first and second bond pads along the surface, said protection circuitry comprising:

a first bipolar transistor having a first p-doped region connected to the first bond pad, a second p-doped region and an n-type base region between the first and second p-doped regions;

a second bipolar transistor having a first n-type region connected in common with the base region of said first transistor, a second n-type region and a p-type base region between the first and second n-type regions, said base region in common with the second p-doped region of the first transistor; and a third bipolar transistor having first and second regions of a first conductivity type and a base region of a second conductivity type between said first and second regions, the first region of said third transistor in common with the base region of either the first or second transistor with one of the first region and the base region of said third transistor having a higher net dopant concentration than the base region of one of the first and second transistors so that during the electrostatic discharge event said third transistor is the first in time among said three transistors to go into conduction thereby injecting current into the base region of one of said first two transistors turning said one of said first two transistors on.

14. The structure of claim 13 formed on a p-conductivity type substrate with a lightly doped n-well formed along a surface thereof and a heavily doped n-region formed along said surface in spaced-apart relation to said n-well.

15. The structure of claim 14 wherein:

said first n-type region of said second transistor is in the lightly doped n-well;

the first region of said third transistor is in common with the base region of said first transistor;

the second region of said third transistor is in the heavily doped n-region; and when said third transistor goes into conduction it injects current into the base region of said second transistor.

16. The structure of claim 13 wherein:

said integrated circuit includes field effect transistors; and the first region of said third transistor is coupled to said first bond pad through a predetermined resistance such that if said first bond pad is positively stressed during the electrostatic discharge event the junction between the first region and the base region of said third transistor will reach avalanche threshold voltage rendering said third transistor conductive before the field effect transistors are damaged.

* * * * *